(12) United States Patent
Oikawa

(10) Patent No.: US 7,598,791 B2
(45) Date of Patent: Oct. 6, 2009

(54) SEMICONDUCTOR INTEGRATED APPARATUS USING TWO OR MORE TYPES OF POWER SUPPLIES

(75) Inventor: Kiyoharu Oikawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/564,603

(22) Filed: Nov. 29, 2006

(65) Prior Publication Data

US 2007/0120577 A1 May 31, 2007

(30) Foreign Application Priority Data

Nov. 30, 2005 (JP) .............................. 2005-345530

(51) Int. Cl.
*H03L 5/00* (2006.01)
(52) U.S. Cl. ........................................ 327/333; 326/62
(58) Field of Classification Search ................. 327/333; 326/62
See application file for complete search history.

(56) References Cited

U.S. PATENT DOCUMENTS

| | | | | |
|---|---|---|---|---|
| 6,040,708 | A * | 3/2000 | Blake et al. ................... 326/33 |
| 6,064,227 | A * | 5/2000 | Saito ............................ 326/68 |
| 6,310,492 | B1 * | 10/2001 | Ikoma et al. .................. 326/81 |
| 6,373,285 | B1 * | 4/2002 | Konishi ........................ 326/81 |
| 6,518,816 | B2 * | 2/2003 | Riccio et al. ................ 327/333 |
| 6,768,368 | B2 * | 7/2004 | Kaneko et al. .............. 327/333 |
| 6,791,392 | B2 | 9/2004 | Maejima et al. |
| 7,005,908 | B2 * | 2/2006 | Lee et al. .................... 327/333 |
| 7,026,855 | B2 * | 4/2006 | Sueoka et al. ............... 327/333 |
| 7,176,720 | B1 * | 2/2007 | Prather et al. ................. 326/80 |
| 7,176,740 | B2 * | 2/2007 | Tachibana et al. ........... 327/333 |
| 7,205,820 | B1 * | 4/2007 | Yeung et al. ................ 327/333 |
| 7,224,201 | B2 * | 5/2007 | Rao et al. .................... 327/333 |
| 7,239,178 | B1 * | 7/2007 | Cornell et al. ................ 326/81 |
| 7,239,191 | B2 * | 7/2007 | Lee ............................. 327/333 |
| 7,295,038 | B2 * | 11/2007 | Seo ............................. 326/81 |
| 7,298,196 | B2 * | 11/2007 | Teraishi ...................... 327/333 |
| 7,323,923 | B2 * | 1/2008 | Maeda et al. ............... 327/333 |
| 7,327,163 | B2 * | 2/2008 | Chauhan et al. .............. 326/68 |
| 7,373,533 | B2 * | 5/2008 | Sahu et al. .................. 713/300 |
| 2003/0011418 | A1 * | 1/2003 | Nishimura et al. .......... 327/333 |

FOREIGN PATENT DOCUMENTS

JP 2003-288331 10/2003

* cited by examiner

*Primary Examiner*—Kenneth B. Wells
(74) *Attorney, Agent, or Firm*—Oblon, Spivak, McClelland, Maier & Neustadt, L.L.P.

(57) ABSTRACT

A semiconductor integrated apparatus includes a control circuit unit which is connected to a low potential power supply terminal and a ground potential power supply terminal, and to which a predetermined low potential power supply output is supplied via the low potential power supply terminal, an output circuit unit which is connected to a high potential power supply terminal and the ground potential power supply terminal, and to which an output from the control circuit unit is supplied, and a detection circuit unit which is connected to the low potential power supply terminal, and which detects a decline in the predetermined low potential power supply output. The apparatus further includes a level shifter circuit which is provided between the control circuit unit and the output circuit unit, and which controls an output level of the output circuit unit in accordance with a detected output from the detection circuit unit.

12 Claims, 4 Drawing Sheets

SEMICONDUCTOR INTEGRATED APPARATUS USING TWO OR MORE TYPES OF POWER SUPPLIES

CROSS-REFERENCE TO RELATED APPLICATIONS

This application is based upon and claims the benefit of priority from prior Japanese Patent Application No. 2005-345530, filed Nov. 30, 2005, the entire contents of which are incorporated herein by reference.

BACKGROUND OF THE INVENTION

1. Field of the Invention

The present invention relates to a semiconductor integrated apparatus. More particularly, the present invention relates to a microcomputer system with multiple power supplies using at least two types of power supplies.

2. Description of the Related Art

Conventionally, a multiple power supply microcomputer system using many types of power supplies has been known. In particular, in a multiple power supply microcomputer system using two types of power supplies (for example, a high potential power supply VDDH and a low potential power supply (internal power supply) VDDL), a decline in low potential power supply VDDL output brings about various failure modes.

For example, a system which uses a low potential power supply VDDL for a central processing unit (CPU), a level shifter circuit, or the like, and uses a high potential power supply VDDH for the level shifter circuit, a peripheral PORT circuit, or the like will be considered. In a case of this system, in a fall-of-potential mode of a low potential power supply VDDL output (for example, refer to the T1*b* period in FIG. 5B), an output from an I/O (input/output) port output terminal P0 of the peripheral PORT circuit is made to be in an indefinite state. Further, in a case of this system, in a potential momentarily blackout mode (for example, refer to the T2*b* period in FIG. 5B), or a low potential power supply LOW (VSS) fixed (CPU coreless) mode (for example, refer to the T3*b* period in FIG. 5B) as well, an output from the I/O port output terminal P0 of the peripheral PORT circuit is made to be in the same way, i.e., in an indefinite state. As a result, due to excessive through currents (IVDDH) TA, TB, and TC which flow between the high potential power supply VDDH and a ground potential power supply VSS, problems such as device breaking, bonding wire cutting, and the like have been brought about.

To describe more concretely, for example, when a fall of potential in low potential power supply VDDL output reaches an inoperative area of a transistor (T1*b*), internal data of the CPU is made to be in an indefinite state. In accordance therewith, an output from the CPU as well is switched to be in an indefinite state. Then, an output from the level shifter circuit connected to the CPU is made to be in an indefinite state, and an output from the I/O port output terminal P0 to which an output from the level shifter circuit is supplied is made to be in an indefinite state. As a result, an excessive through current (IVDDH) TA flows between the high potential power supply VDDH and the ground potential power supply VSS, which brings about device breaking and bonding wire cutting.

On the other hand, for example, when a low potential power supply VDDL output is momentarily broken (T2*b*), an internal circuit output of the CPU is made to be in a floating state. In accordance therewith, an output from the CPU is switched to be in an indefinite state. Then, an output from the level shifter circuit is made to be in an indefinite state, and an output from the I/O port output terminal P0 is made to be in an indefinite state. As a result, an excessive through current (IVDDH) TB flows between the high potential power supply VDDH and the ground potential power supply VSS, which brings about device breaking and bonding wire cutting.

Further, in a test mode, for example, when a low potential power supply VDDL output is fixed to a LOW (VSS) level (T3*b*), an internal circuit output of the CPU is made to be in a VSS level fixed state. In accordance therewith, an output from the CPU is switched to be in a VSS level fixed state. Then, the level shifter circuit is made unable to normally operate, and an output from the level shifter circuit is made to be in an indefinite state, and an output from the I/O port output terminal is made to be in an indefinite state. As a result, an excessive through current (IVDDH) TC flows between the high potential power supply VDDH and the ground potential power supply VSS, which brings about device breaking and bonding wire cutting.

As described above, in a conventional multiple power supply microcomputer system, in a fall-of-potential mode, a potential momentarily blackout mode, or a low potential power supply LOW (VSS) fixed mode of a low potential power supply VDDL output, an output from the level shifter circuit is made to be in an indefinite state. Therefore, there have been problems that excessive through currents IVDDH flow between the high potential power supply VDDH and the ground potential power supply VSS, which brings about device breaking, bonding wire cutting, and the like.

Note that, as a prior art relating to the present invention, an apparatus in which unnecessary through current in an output circuit interface is suppressed has been already proposed (for example, refer to Jpn. Pat. Appln. KOKAI Publication No. 2003-288331). However, in this proposal, a power supply switch is provided in the level shift circuit used for the output circuit interface of the multiple power supply microcomputer, and that switch is controlled by control signals (a power-off control signal, a power-on control signal) at VDDH levels.

BRIEF SUMMARY OF THE INVENTION

According to a first aspect of the present invention, there is provided a semiconductor integrated apparatus comprising: a control circuit unit which is connected to a low potential power supply terminal and a ground potential power supply terminal, and to which a predetermined low potential power supply output is supplied via the low potential power supply terminal; an output circuit unit which is connected to a high potential power supply terminal and the ground potential power supply terminal, and to which an output from the control circuit unit is supplied; a detection circuit unit which is connected to the low potential power supply terminal, and which detects a decline in the predetermined low potential power supply output; and a level shifter circuit which is provided between the control circuit unit and the output circuit unit, and which controls an output level of the output circuit unit in accordance with a detected output from the detection circuit unit.

DETAILED DESCRIPTION OF THE INVENTION

Embodiments of the present invention will be described with reference to the accompanying drawings. It should be noted that the drawings are schematic ones and the dimension ratios shown therein are different from the actual ones. The dimensions vary from drawing to drawing and so do the ratios of dimension. The following embodiments are directed to a device and a method for embodying the technical concept of the present invention and the technical concept does not specify the material, shape, structure or configuration of components of the present invention. Various changes and modifications can be made to the technical concept without departing from the scope and the claimed invention.

FIRST EMBODIMENT

Figure 1:
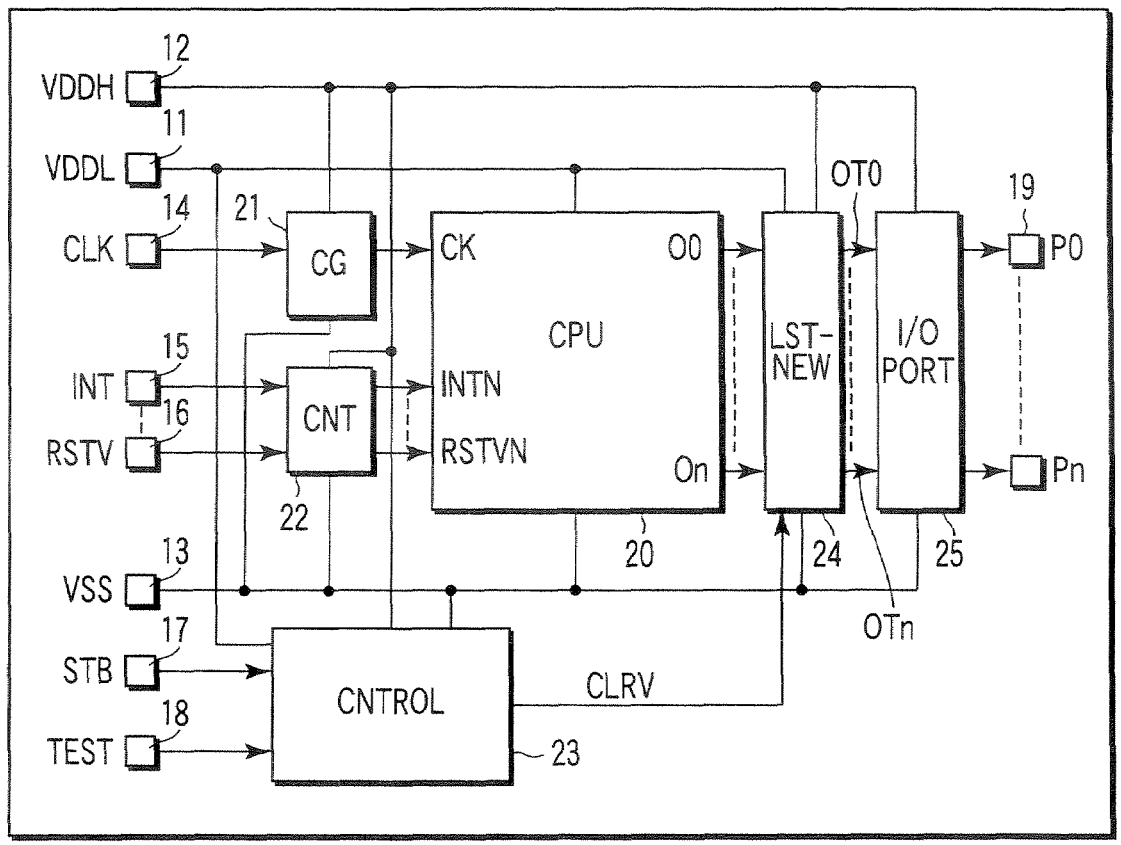
FIG. 1 is a block diagram showing a structural example of a semiconductor integrated apparatus (multiple power supply microcomputer system) according to a first embodiment of the present invention.

FIG. 1 shows a basic structure of a multiple power supply microcomputer system (semiconductor integrated apparatus) according to a first embodiment of the present invention. In the present embodiment, a case will be described in which, in a multiple power supply microcomputer system using a high potential power supply VDDH and a low potential power supply VDDL, a high potential power supply VDDH output is 3V, and a low potential power supply VDDL output is 1.5V.

Namely, for example, as shown in FIG. 1, the multiple power supply microcomputer system has a low potential power supply (VDDL) terminal 11, a high potential power supply (VDDH) terminal 12, a ground potential power supply (VSS) terminal 13, a clock (CLK) terminal 14, a cause-of-interrupt (INT) terminal 15, a system reset (RSTV) terminal 16, a standby mode (STB) terminal 17, a test (TEST) terminal 18, I/O (input/output) port output terminals (P0 to Pn) 19, a CPU (control circuit unit) 20, a system clock generating circuit (CG) 21, an interrupt & reset control circuit (CNT) 22, a low potential power supply & test mode detection circuit (CNTROL) 23 serving as a detection circuit unit, a level shifter circuit (LST-NEW) 24, a peripheral PORT circuit (I/O PORT) 25 serving as an output circuit unit, and the like. A low potential power supply VDDL output serving as a first potential is supplied from the outside of the system to the low potential power supply terminal 11. A high potential power supply VDDH output serving as a second potential which is higher than the first potential is supplied from the outside of the system to the high potential power supply terminal 12. A ground potential VSS is supplied from the outside of the system to the ground potential power supply terminal 13.

Not only the clock terminal 14, but also the high potential power supply terminal 12, the ground potential power supply terminal 13, and the CPU 20 are connected to the system clock generating circuit 21. The system clock generating circuit 21 is operated by a high potential power supply VDDH output of 3V applied from the high potential power supply terminal 12, and generates an internal clock CK on the basis of a reference clock CLK supplied from the clock terminal 14. Further, the system clock generating circuit 21 supplies the generated internal clock CK to the CPU 20.

Not only the cause-of-interrupt terminal 15 and the system reset terminal 16, but also the high potential power supply terminal 12, the ground potential power supply terminal 13, and the CPU 20 are connected to the interrupt & reset control circuit 22. The interrupt & reset control circuit 22 is operated by a high potential power supply VDDH output of 3V applied from the high potential power supply terminal 12. For example, the interrupt & reset control circuit 22 supplies an interrupt signal INTN to the CPU 20 in accordance with an input to the cause-of-interrupt terminal 15. Further, the interrupt & reset control circuit 22 supplies a reset signal RSTVN to the CPU 20 in accordance with an input to the system reset terminal 16.

An input terminal for an internal clock CK, an input terminal for an interrupt signal INTN, an input terminal for a reset signal RSTVN, and output terminals O0 to On are provided to the CPU 20. Further, the low potential power supply terminal 11 and the ground potential power supply terminal 13 are connected to the CPU 20. The CPU 20 is operated by a low potential power supply VDDL output of 1.5V applied from the low potential power supply terminal 11. Further, the CPU 20 supplies CPU outputs to the level shifter circuit 24 from the output terminals O0 to On.

The output terminals O0 to On of the CPU 20, the high potential power supply terminal 12, and the ground potential power supply terminal 13 are connected to the level shifter circuit 24, and output terminals OT0 to OTn are provided to the level shifter circuit 24. The level shifter circuit 24 is operated by a high potential power supply VDDH output of 3V applied from the high potential power supply terminal 12. For example, the level shifter circuit 24 shifts a signal level of an output from the CPU 20 in accordance with an output level of the peripheral PORT circuit 25. Thereafter, the level shifter circuit 24 outputs it from the output terminals OT0 to OTn to the peripheral PORT circuit 25.

Further, the level shifter circuit 24 has a retaining circuit (the details will be described later) for retaining control data (level shift potential) supplied from the low potential power supply & test mode detection circuit 23. Namely, the low potential power supply terminal 11 is connected to the level shifter circuit 24, and an output (CLRV) terminal of the low potential power supply & test mode detection circuit 23 is connected thereto. Control data is for controlling, for example, in a fall-of-potential mode of a low potential power supply VDDL output, so as to maintain an output level of the peripheral PORT circuit 25 in a state before the low potential power supply VDDL output decreases.

The output terminals OT0 to OTn of the level shifter circuit 24 and the above-described I/O port output terminals 19 are connected to the peripheral PORT circuit 25, and the high potential power supply terminal 12 and the ground potential power supply terminal 13 are connected thereto. The peripheral PORT circuit 25 is operated by a high potential power supply VDDH output of 3V applied from the high potential power supply terminal 12, and outputs an output of the CPU 20 supplied from the level shifter circuit 24, from the I/O port output terminals 19. Note that the peripheral PORT circuit 25 is structured such that, even in a mode when a low potential power supply VDDL output decreases, it is possible to output an output of the CPU 20 at an output level before the low potential power supply VDDL output decreases.

The low potential power supply terminal 11, the high potential power supply terminal 12, and the ground potential power supply terminal 13 are connected to the low potential power supply & test mode detection circuit 23, and the output terminal connected to the level shifter circuit 24 is provided thereto. The low potential power supply & test mode detection circuit 23 is operated by a high potential power supply VDDH output of 3V applied from the high potential power supply terminal 12, and detects a fall-of-potential state and a potential momentarily blackout state of, for example, a predetermined low potential power supply VDDL output, on the basis of a decline in a low potential power supply VDDL output. Then, a detected output thereof (CLRV) is output to the above-described level shifter circuit 24.

Note that, in a case of the present embodiment, the standby mode terminal 17 for setting a low-current consumption mode in a standby mode is further connected to the low potential power supply & test mode detection circuit 23. Further, the test terminal 18 serving as a test signal input terminal for setting a state of a low potential power supply LOW (VSS) fixed mode is connected to the low potential power supply & test mode detection circuit 23.

Figure 2:
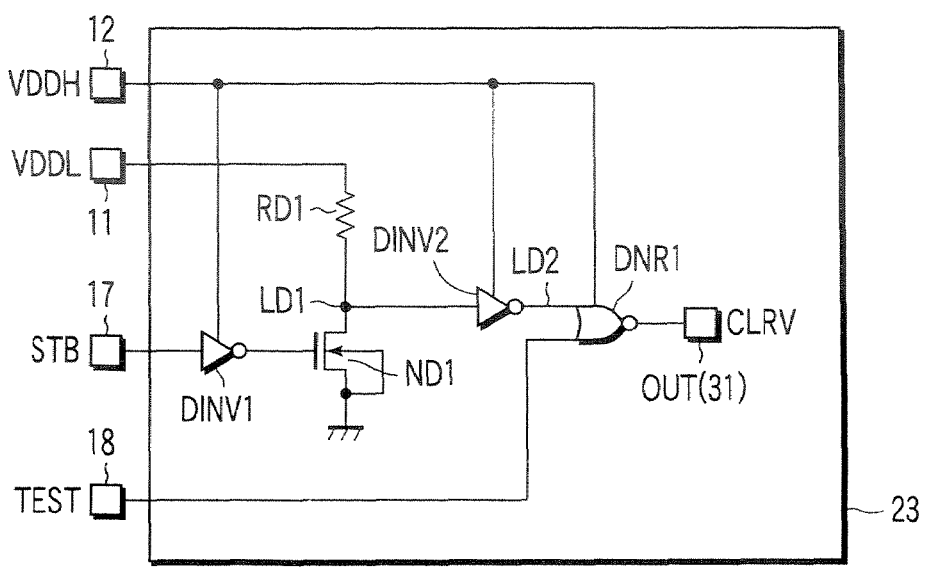
FIG. 2 is a circuit diagram showing a structural example of a low potential power supply & test mode detection circuit which is used for the multiple power supply microcomputer system of FIG. 1.

FIG. 2 shows a structural example of the low potential power supply & test mode detection circuit 23 in the multiple power supply microcomputer system described above. In a case of the present embodiment, a drain of an N-channel MOS (Metal Oxide Semiconductor) transistor ND1 is connected to the low potential power supply terminal 11 via a resistor RD1. A source of the N-channel MOS transistor is grounded, and is connected to a back gate. A gate of the N-channel MOS transistor is connected to an output terminal of an inverter circuit DINV1. The above-described standby mode terminal 17 is connected to an input terminal of the inverter circuit DINV1.

Further, in the present embodiment, an input terminal of an inverter circuit DINV2 is connected to a junction (node LD1) between the resistor RD1 and the drain of the N-channel MOS transistor ND1. An output terminal of the inverter circuit DINV2 is connected to one input terminal of a NOR circuit NDR1. The above-described test terminal 18 is connected to the other input terminal of the NOR circuit NDR1. Then, an output terminal of the NOR circuit NDR1 is connected to an output terminal (OUT) 31 for outputting a detected output (CLRV) to the level shifter circuit 24.

Note that the high potential power supply terminal 12 is connected to the above-described inverter circuits DINV1 and DINV2, and the above-described NOR circuit NDR1, and high potential power supply VDDH outputs of 3V are respectively supplied to those from the high potential power supply terminal 12.

In such a structure, in a fall-of-potential mode, a potential momentarily blackout mode, or a low potential power supply LOW (VSS) fixed mode of a low potential power supply VDDL output, respectively, a detected output (CLRV) at a LOW level is outputted from the output terminal 31 to the level shifter circuit 24. Namely, for example, suppose that a potential of the node LD1 declines to be lower than a threshold value (specified value) of the inverter circuit DINV2 in accordance with a decline in a low potential power supply VDDL output. Then, a detected output (CLRV) serving as an output from the NOR circuit DNR1 is made to be at a LOW level. Further, when a test signal (at a HIGH level) is inputted from the test terminal 18, a detected output (CLRV) serving as an output from the NOR circuit DNR1 is made to be at a LOW level regardless of an input to one input terminal of the NOR circuit DNR1.

Note that, when a control signal (at a LOW level) is inputted from the standby mode terminal 17 in a standby mode, the N-channel MOS transistor ND1 is made to be in an on-state. In accordance therewith, the low potential power supply & test mode detection circuit 23 is made to be in a low-current consumption mode.

Figure 3:
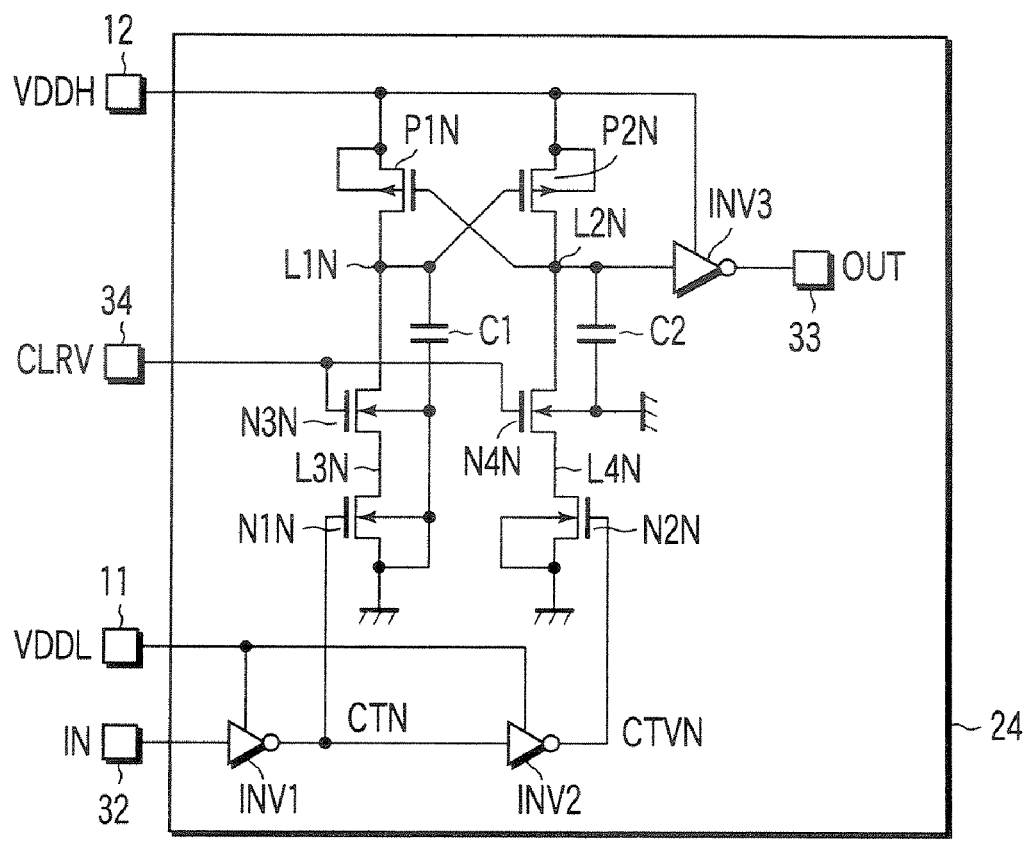
FIG. 3 is a circuit diagram showing a structural example of a level shifter circuit which is used for the multiple power supply microcomputer system of FIG. 1.

FIG. 3 shows a structural example of the level shifter circuit 24 in the multiple power supply microcomputer system described above. In the present embodiment, a case in which the retaining circuit for retaining control data is structure by using capacitative elements will be described.

Namely, for example, as shown in FIG. 3, an input terminal (IN) 32 for taking in outputs from the output terminals O0 to On of the CPU 20 is provided to the level shifter circuit 24 in the present embodiment. An input terminal of the inverter circuit INV1 is connected to the input terminal 32. An output terminal of the inverter circuit INV1 (an output side of an inversion signal CTN) is connected to an input terminal of the inverter circuit INV2 and a gate of the N-channel MOS transistor N1N. The output terminal of the inverter circuit INV2 (the output side of an inversion signal CTVN) is connected to a gate of the N-channel MOS transistor N2N.

Note that the low potential power supply terminal 11 is connected respectively to the above-described inverter circuits INV1 and INV2. Namely, low potential power supply VDDL outputs of 1.5V are supplied to the inverter circuits INV1 and INV2 via the low potential power supply terminal 11.

On the other hand, sources and back gates of P-channel MOS transistors P1N and P2N are connected to the high potential power supply terminal 12. Further, an inverter circuit INV3 is connected to the high potential power supply terminal 12. Namely, a high potential power supply VDDH output of 3V is supplied to the inverter circuit INV3 via the high potential power supply terminal 12. An output terminal of the inverter circuit INV3 is connected to an output terminal (OUT) 33 corresponding to the above-described output terminals OT0 to OTn.

Moreover, an input terminal (CLRV) 34, to which an output from the low potential power supply & test mode detection circuit 23 (a detected output CLRV) is supplied, is provided to the level shifter circuit 24 in the present embodiment. Gates of N-channel MOS transistors N3N and N4N are respectively connected to the input terminal 34. Namely, the gate of the P-channel MOS transistor P2N is connected respectively to a drain of the P-channel MOS transistor P1N, a drain of the N-channel MOS transistor N3N, and one electrode of a capacitative element C1. The other electrode of the capacitative element C1 is connected respectively to respective back gates of the N-channel MOS transistors N1N and N3N, and the source of the N-channel MOS transistor N1N. The source of the N-channel MOS transistor N1N is grounded (or connected to the ground potential power supply terminal 13), and the drain thereof is connected to the drain of the N-channel MOS transistor N3N.

On the other hand, the gate of the P-channel MOS transistor P1N is connected respectively to the drain of the P-channel MOS transistor P2N, the drain of the N-channel MOS transistor N4N, the input terminal of the inverter circuit INV3, and one electrode of a capacitative element C2. The capacitative elements C1 and C2 are structured by using, for example, MOS gate capacitances, junction capacitances, or the like, and the capacitances c (C1=C2) are the same. The other electrode of the capacitative element C2 is connected to the back gate of the N-channel MOS transistor N4N which is grounded. The source of the N-channel MOS transistor N4N is connected to the drain of the N-channel MOS transistor N2N. The source of the N-channel MOS transistor N2N is connected to the back gate, and is grounded.

In such a structure, a decline in a low potential power supply VDDL output is detected by the low potential power supply & test mode detection circuit 23. Namely, when a detected output (CLRV) is made to be at a LOW level, the N-channel MOS transistors N3N and N4N of the level shifter circuit 24 are cut off. In accordance therewith, electric charges (at stable "0" or "1" level) serving as control data for controlling so as to maintain an output level of the peripheral PORT circuit 25 in a state before the low potential power supply VDDL output decreases, are retained by the capacitative elements C1 and C2. Therefore, even when a low potential power supply VDDL output decreases, it is possible to obtain an output at a stable signal level from the I/O port output terminals 19.

Namely, the level shifter circuit 24 is in a system in which outputs from the output terminals O0 to On of the CPU 20 supplied to the input terminal 32 are level-shifted by NMOS amplifying circuits (N1N, N2N) with PMOS cross-link circuits (P1N, P2N) as loads. Namely, in the level shifter circuit 24 in this system, switches (N3N, N4N) serially connected to the NMOS amplifying circuits (N1N, N2N) are controlled on the basis of a detected output (CLRV). In accordance therewith, paths between outputs from the PMOS cross-link circuits (P1N, P2N) and a ground potential (VSS) are turned on/off. As a result, even when a predetermined low potential power supply VDDL output decreases to be lower than or equal to a specified value (for example, 0.8V), it is possible to retain a level shift potential immediately before it by the capacitative elements C1 and C2.

Figure 4:
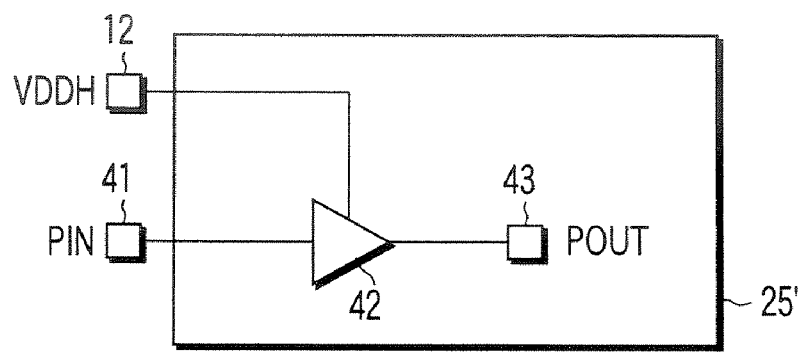
FIG. 4 is a circuit diagram showing a structural example of a peripheral PORT circuit (output stage) which is used for the multiple power supply microcomputer system of FIG. 1.

FIG. 4 shows a structural example of the peripheral PORT circuit 25 in the multiple power supply microcomputer system described above. Note that, in the present embodiment, only an output stage (a buffer unit) in the peripheral PORT circuit 25 is extracted to be shown.

Namely, for example, as shown in FIG. 4, an input terminal (PIN) 41 for taking in outputs from the output terminals (O0 to On) 33 of the level shifter circuit 24 is provided to an output stage 25' in the peripheral PORT circuit 25. An input terminal of a buffer circuit 42 is connected to the input terminal 41. An output terminal of the buffer circuit 42 is connected to an output terminal (POUT) 43 connected to the above-described I/O port output terminal 19.

Note that the high potential power supply terminal 12 is connected to the buffer circuit 42, and a high potential power supply VDDH output of 3V is supplied to the buffer circuit 42 via the high potential power supply terminal 12.

Next, operations when a low potential power supply VDDL output decreases in the multiple power supply microcomputer system described above will be described. Note that, in the present embodiment, operations in respective states which are typified by a fall-of-potential mode, a potential momentarily blackout mode, and a low potential power supply LOW (VSS) fixed mode, will be described.

Figure 5A:
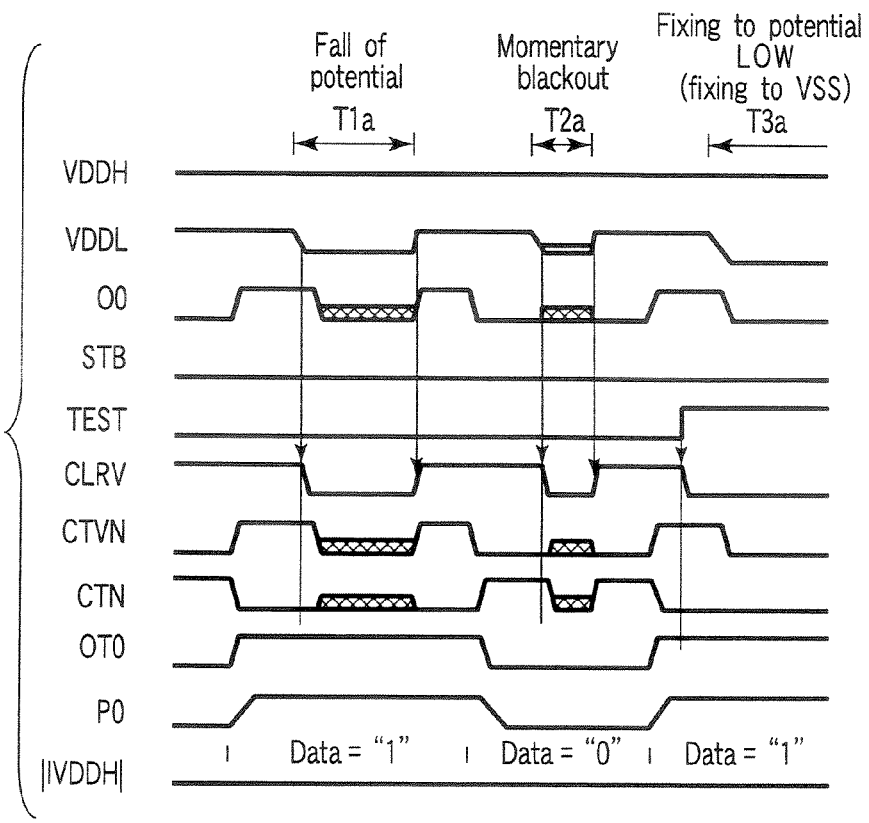
FIGS. 5A and 5B are timing charts shown for explanation of operations in decline in a low potential power supply VDDL output in the multiple power supply microcomputer system shown in FIG. 1.
Figure 5B:
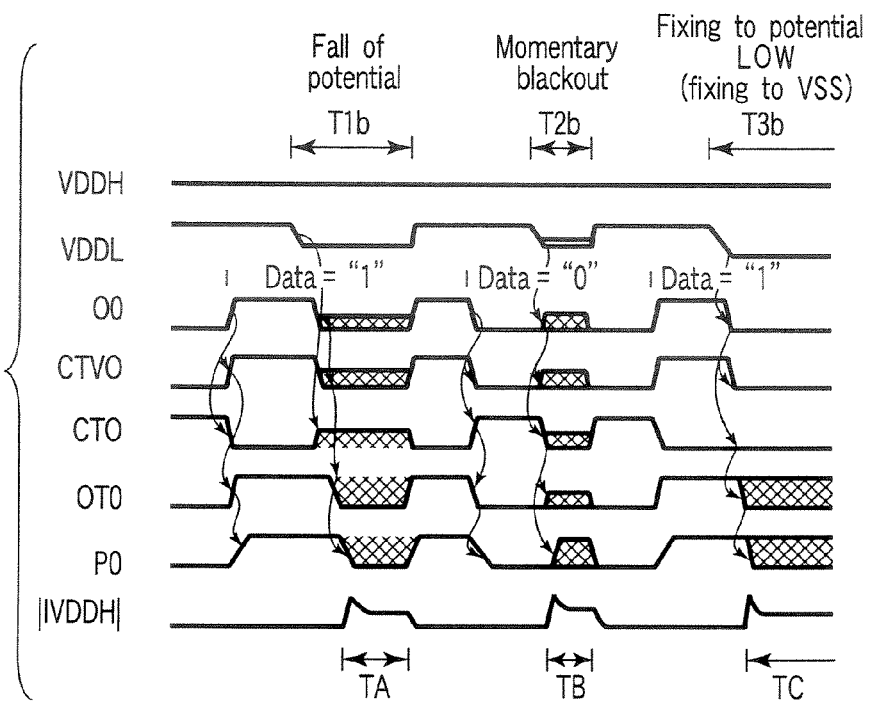

FIGS. 5A and 5B are timing charts shown for explanation of operations in the respective states when a low potential power supply VDDL output decreases. Note that FIG. 5A shows signal waveforms in the respective states in the multiple power supply microcomputer system according to the present embodiment. Further, FIG. 5B shows signal waveforms in the respective states in the conventional multiple power supply microcomputer system shown for comparison.

In a fall-of-potential mode of a low potential power supply VDDL output (T1a period), for example, as shown in FIG. 5A, a decline in a low potential power supply VDDL output is detected by the low potential power supply & test mode detection circuit 23. Then, the detected output (CLRV) is made to be in a state at a LOW level. In this case, conventionally, internal data of the CPU 20 is made to be in an indefinite state, and an output from an output terminal (for example, O0) as well is made to be in an indefinite state (refer to the T1b period in FIG. 5B).

In contrast thereto, the level shifter circuit 24 in the present embodiment retains a level shift potential before the fall of potential, as an output from an output terminal (for example. OT0). Namely, "1" serving as control data is retained by the capacitative elements C1 and C2. Therefore, an output before the fall of potential (for example, data "1") continues to appear on the I/O port output terminal (P0) 19. Therefore, it is possible to prevent an excessive through current (IVDDH) TA from flowing between the high potential power supply (VDDH) and the ground potential power supply (VSS) as shown in FIG. 5B. Accordingly, problems such as device breaking, and bonding wire cutting between the high potential power supply terminal 12 and the buffer circuit 42 at the output stage 25' of the peripheral PORT circuit 25 can be solved.

Further, in a potential momentarily blackout mode of a low potential power supply VDDL output (T2a period), for example, as shown in FIG. 5A, a decline in the low potential power supply VDDL output is detected by the low potential power supply & test mode detection circuit 23. Then, the detected output (CLRV) is made to be in a LOW level state. In this case, conventionally, an internal circuit output of the CPU 20 is made to be in a floating state, and an output of an output terminal (for example, O0) as well is switched to be in an indefinite state (refer to the T2b period in FIG. 5B).

In contrast thereto, the level shifter circuit 24 in the present embodiment retains a level shift potential before the momentarily-blackout of potential, as an output from an output terminal (for example, OT0). Namely, "0" serving as control data is retained by the capacitative elements C1 and C2. Therefore, an output before the momentarily-blackout of potential (for example, data "0") continues to appear on the I/O port output terminal (P0) 19. Therefore, it is possible to prevent an excessive through current (IVDDH) TB from flowing between the high potential power supply (VDDH) and the ground potential power supply (VSS) as shown in FIG. 5B. Accordingly, problems such as device breaking, and bonding wire cutting between the high potential power supply terminal 12 and the buffer circuit 42 at the output stage 25' of the peripheral PORT circuit 25 can be solved.

Further, in a low potential power supply LOW (VSS) fixed mode (the T3a period), for example, as shown in FIG. 5A, a decline in a low potential power supply VDDL output is detected by the low potential power supply & test mode detection circuit 23. In the present embodiment, fixing of a low potential power supply VDDL output to LOW (VSS) is specified as a coreless mode test. Namely, the low potential power supply & test mode detection circuit 23 detects a setting of a low potential power supply LOW (VSS) fixed mode by inputting a test signal (TEST) to the test terminal 18. Then, the detected output (CLRV) is made to be in a LOW level state. In this case, conventionally, an internal circuit output of the CPU 20 is made to be in a VSS level fixed state, and an output from an output terminal (for example, O0) as well is made to be in a VSS level fixed state (refer to the T3b period in FIG. 5B). Further, both of inversion signals in the level shifter circuit (output signals CT0, CTV0 from the inverter circuits INV1 and INV2) are made to be at a LOW level.

In contrast thereto, the level shifter circuit 24 in the present embodiment retains a level shift potential before the setting of test mode, as an output from an output terminal (for example. OT0). Namely, "1" serving as control data is retained by the capacitative elements C1 and C2. Therefore, an output before the setting of test mode (for example, data "1") continues to appear on the I/O port output terminal (P0) 19. Therefore, it is possible to prevent an excessive through current (IVDDH) TC from flowing between the high potential power supply (VDDH) and a ground potential power supply (VSS) as shown in FIG. 5B. Accordingly, problems such as device breaking, and bonding wire cutting between the high potential power supply terminal 12 and the buffer circuit 42 at the output stage 25' of the peripheral PORT circuit 25 can be solved.

As described above, in accordance with the multiple power supply microcomputer system according to the present embodiment, at least in a fall-of-potential mode (the T1a period), a potential momentarily blackout mode (the T2a period), and a low potential power supply LOW (VSS) fixed mode (the T3a period) of a low potential power supply VDDL output, a decline in a low potential power supply VDDL output can be detected by the low potential power supply & test mode detection circuit 23. Further, states before switching to the respective modes (level shift potentials) can be retained by the level shifter circuit 24. In accordance therewith, it is possible to control an output level from the peripheral PORT circuit 25 to be in a state before a low potential power supply VDDL output decreases. As a result, even when a low potential power supply VDDL output decreases, it is possible to obtain an output at a stable signal level from the I/O port output terminal. Therefore, it is possible to prevent an excessive through current (IVDDH) from flowing between the high potential power supply (VDDH) and the ground potential power supply (VSS), which makes it possible to prevent device breaking and bonding wire cutting.

SECOND EMBODIMENT

Figure 6:
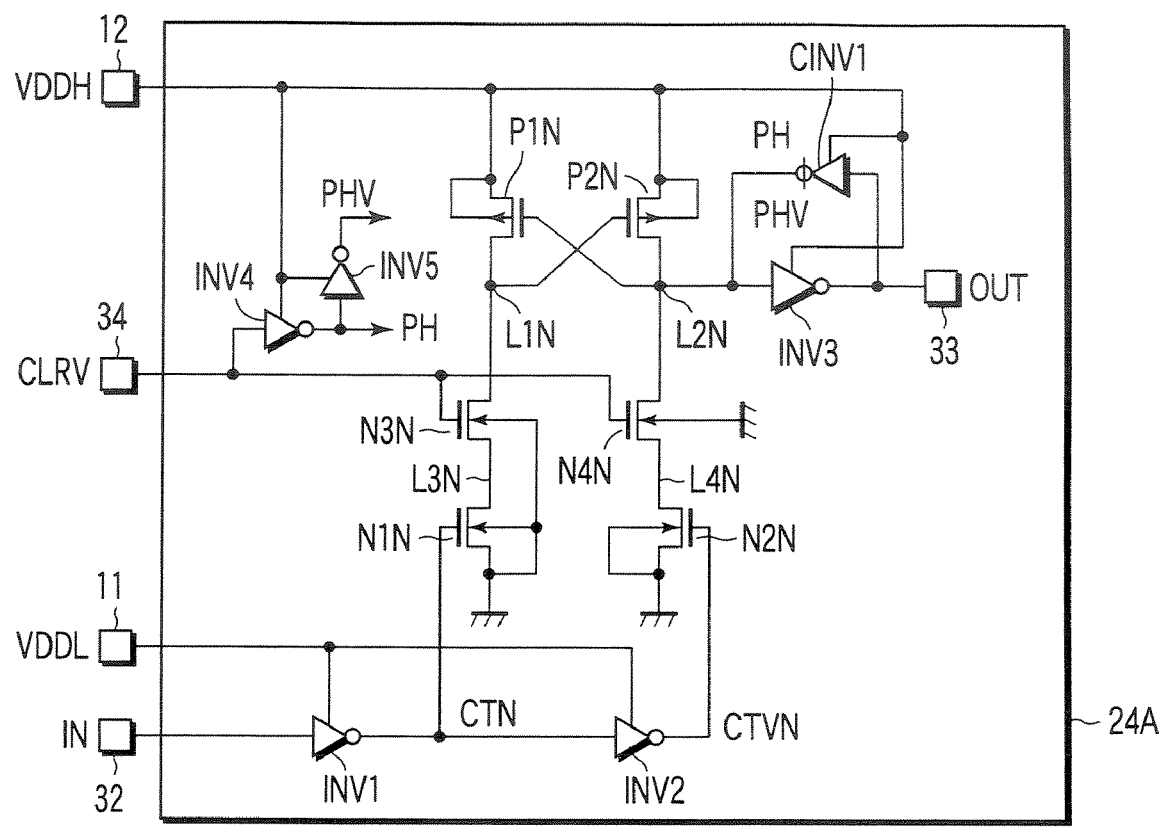
FIG. 6 is a circuit diagram showing a structural example of a level shifter circuit which is used for a semiconductor integrated apparatus (multiple power supply microcomputer system) according to a second embodiment of the present invention.

FIG. 6 shows another structural example of a level shifter circuit in a multiple power supply microcomputer system (semiconductor integrated apparatus) according to a second embodiment of the present invention. In the present embodiment, there will be described a case in which the retaining circuit for retaining control data is structured by using inverter circuits and a clocked inverter circuit. Note that portions which are the same as those in FIG. 3 are denoted by the same reference numerals, and detailed descriptions thereof will be omitted.

Namely, in a case of a level shifter circuit 24A of the present embodiment, for example, as shown in FIG. 6, the sources and the back gates of the P-channel MOS transistors P1N and P2N are connected to the high potential power supply terminal 12. Further, inverter circuits INV3, INV4, and INV5, and a clocked inverter circuit CINV1 are connected to the high potential power supply terminal 12. High potential power supply VDDH outputs of 3V are respectively supplied to the inverter circuits INV3, INV4, and INV5, and the clocked inverter circuit CINV1 from the high potential power supply terminal 12. An output terminal of the inverter circuit INV3 is connected to the output terminal (OUT) 33 corresponding to the output terminals (OT0 to OTn).

Further, the gates of the N-channel MOS transistors N3N and N4N, and the input terminal of the inverter circuit INV4 are connected to the input terminal (CLRV) 34 to which an output of the low potential power supply & test mode detection circuit 23 (a detected output CLRV) is supplied. An output terminal of the inverter circuit INV4 is connected respectively to the input terminal of the inverter circuit INV5 and one end of a clock terminal of the clocked inverter circuit CINV1. An output terminal of the inverter circuit INV5 is connected to the other end of the clock terminal of the clocked inverter circuit CINV1.

Note that the gate of the P-channel MOS transistor P2N is connected to the drain of the P-channel MOS transistor P1N and the drain of the N-channel MOS transistor N3N. The source of the N-channel MOS transistor N3N is connected to the drain of the N-channel MOS transistor N1N. The source of the N-channel MOS transistor N1N is grounded, and is connected to the respective back gates of the N-channel MOS transistors N1N and N3N.

On the other hand, the gate of the P-channel MOS transistor P1N is connected respectively to the drain of the P-channel MOS transistor P2N, the drain of the N-channel MOS transistor N4N, and the input terminal of the inverter circuit INV3. Then, the clocked inverter circuit CINV1 is inserted reversely between the input/output terminals of the inverter circuit INV3. Namely, the output terminal of the clocked inverter circuit CINV1 is connected to the input terminal side of the inverter circuit INV3, and the input terminal of the clocked inverter circuit CINV1 is connected to the output terminal side of the inverter circuit INV3.

In such a structure as well, a decline in a low potential power supply VDDL output is detected by the low potential power supply & test mode detection circuit 23. Namely, when a detected output (CLRV) is made to be at a LOW level, the N-channel MOS transistors N3N and N4N of the level shifter circuit 24A are cut off. Further, clock signals of the clocked inverter circuit CINV1 are generated by the inverter circuits INV4 and INV5. In accordance therewith, a signal (at a stable "0" or "1" level) serving as control data for controlling so as to maintain an output level of the peripheral PORT circuit 25 in a state before the low potential power supply VDDL output decreases, is retained by the clocked inverter circuit CINV1. Therefore, even when a low potential power supply VDDL output decreases, it is possible to obtain a stable output from the I/O port output terminals 19.

Accordingly, in a case of the present embodiment as well, for example, as shown in FIG. 5A, at least in a fall-of-potential mode (the T1a period), a potential momentarily blackout mode (the T2a period), and a low potential power supply LOW (VSS) fixed mode (the T3a period) of a low potential power supply VDDL output, states before switching to the respective modes can be retained. As a result, it is possible to obtain an output at a stable signal level from an I/O port output terminal. Further, it is possible to prevent an excessive through current (IVDDH) from flowing between the high potential power supply (VDDH) and the ground potential power supply (VSS), which makes it possible to prevent device breaking and bonding wire cutting.

Note that, in the respective embodiments, the cases in a fall-of-potential mode, a potential momentarily blackout mode, and a low potential power supply LOW (VSS) fixed mode have been described as modes of a decline in a low potential power supply VDDL output. However, this is not limited thereto.

Further, it goes without saying that, in any of the embodiments, the present invention is not limited to a case in which a high potential power supply VDDH output is 3V, and a low potential power supply VDDL output is 1.5V.

Further, the present invention is not limited to a case of two power supplies at a high potential and a low potential, and can be applied to a multiple power supply microcomputer system with three or more power supplies.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated apparatus, comprising:
a control circuit unit which is connected to a low potential power supply terminal and a ground potential power supply terminal, and to which a low potential power supply output is supplied from an external point of the apparatus via the low potential power supply terminal;
an output circuit unit which is connected to a high potential power supply terminal and the ground potential power supply terminal and which has an output level controlled based on control data, the high potential power supply terminal having a high potential power supply output higher than the low potential power supply output;
a detection circuit unit which has a test terminal, is connected to the low potential power supply terminal, and detects a decline in the low potential power supply output; and
a level shifter circuit which is connected between the control circuit unit and the output circuit unit and which controls the output level of the output circuit unit in response to a detected output from the detection circuit unit,
wherein the detection circuit unit includes a NOR circuit whose output becomes low in level when the low potential power supply output decreases to a value smaller than a predetermined value or when a test signal is supplied to the test terminal,
wherein the level shifter circuit includes:
a cross-link circuit to which the high potential power supply output is supplied and which includes first and second P-channel metal oxide semiconductor (PMOS) transistor;
an amplifying circuit to which the cross-link circuit is a load, and which includes first and second N-channel metal oxide semiconductor (NMOS) transistors;
a switch which is serially connected in series with the amplifying circuit and which is controlled in accordance with a detection output of the detection circuit unit so as to turn on or turn off a path between the cross-link circuit and a ground potential, the switch including third and fourth NMOS transistors; and
a capacitive element which retains the control data to keep the output level of the output circuit unit in a state assumed before the low potential power supply output decreases.

2. The semiconductor integrated apparatus according to claim 1, wherein the high potential power supply terminal and the ground potential power supply terminal are further connected to the detection circuit unit.

3. The semiconductor integrated apparatus according to claim 1, wherein the detection circuit unit detects a fall-of-potential state due to a decline in the low potential power supply output.

4. The semiconductor integrated apparatus according to claim 1, wherein the detection circuit unit detects a potential momentarily blackout state due to a decline in the low potential power supply output.

5. The semiconductor integrated apparatus according to claim 1, wherein the detection circuit unit detects how a CPU coreless mode state is set in response to input of the test signal.

6. The semiconductor integrated apparatus according to claim 1, wherein the detection circuit unit has a standby mode set terminal to set a low-current consumption mode in a standby mode.

7. A semiconductor integrated apparatus, comprising:
a control circuit unit which is connected to a low potential power supply terminal and a ground potential power supply terminal, and to which a low potential power supply output is supplied from an external point of the apparatus via the low potential power supply terminal;
an output circuit unit which is connected to a high potential power supply terminal and the ground potential power supply terminal and which has an output level controlled based on control data, the high potential power supply terminal being having a high potential power supply output higher than the low potential power supply output;
a detection circuit unit which has a test terminal, is connected to the low potential power supply terminal, and detects a decline in the low potential power supply output; and
a level shifter circuit which is connected between the control circuit unit and the output circuit unit and which controls the output level of the output circuit unit in response to a detected output from the detection circuit unit,
wherein the detection circuit unit includes a NOR circuit whose output becomes low in level when the low potential power supply output decreases to a value smaller than a predetermined value or when a test signal is supplied to the test terminal,
wherein the level shifter circuit includes:
a cross-link circuit to which the high potential power supply output is supplied and which includes first and second P-channel metal oxide semiconductor (PMOS) transistors;
an amplifying circuit to which the cross-link circuit is a load and which includes first and second N-channel metal oxide semiconductor (NMOS) transistors;
a switch which is serially connected in series with the amplifying circuit and which is controlled in accordance with a detection output of the detection circuit unit so as to turn on or turn off a path between the cross-link circuit and a ground potential, the switch including third and fourth NMOS transistors;
first and second inverter circuits which generate clock signals in response to an off state of the third and fourth NMOS transistors; and
a clocked inverter circuit which is responsive to the clock signals supplied from the first and second inverter circuits and retains the control data to keep the output level of the output circuit unit in a state assumed before the low potential power supply output decreases.

8. The semiconductor integrated apparatus according to claim 7, wherein the high potential power supply terminal and the ground potential power supply terminal are further connected to the detection circuit unit.

9. The semiconductor integrated apparatus according to claim 7, wherein the detection circuit unit detects a fall-of-potential state due to a decline in the low potential power supply output.

10. The semiconductor integrated apparatus according to claim 7, wherein the detection circuit unit detects a potential blackout state due to a decline in the low potential power supply output.

11. The semiconductor integrated apparatus according to claim 7, wherein the detection circuit unit detects how a CPU coreless mode state is set in response to input of the test signal.

12. The semiconductor integrated apparatus according to claim 7, wherein the detection circuit unit has a standby mode set terminal to set a low-current consumption mode in a standby mode.

* * * * *